United States Patent
Park et al.

(10) Patent No.: US 8,194,705 B2
(45) Date of Patent: *Jun. 5, 2012

(54) METHOD FOR FORMATTING DIGITAL BROADCAST TRANSPORT STREAM PACKET FOR IMPROVED RECEIVING PERFORMANCE, DIGITAL BROADCAST TRANSMITTER, AND SIGNAL PROCESSING METHOD THEREOF

(75) Inventors: Eui-jun Park, Seoul (KR); Dong-il Song, Suwon-si (KR); Choon-sik Jung, Suwon-si (KR); Jin-hee Jeong, Anyang-si (KR); Hee-beom Kang, Hwaseong-si (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 481 days.

This patent is subject to a terminal disclaimer.

(21) Appl. No.: 12/249,193

(22) Filed: Oct. 10, 2008

(65) Prior Publication Data

US 2009/0074081 A1    Mar. 19, 2009

Related U.S. Application Data

(63) Continuation of application No. 11/416,204, filed on May 3, 2006.

(60) Provisional application No. 60/683,304, filed on May 23, 2005, provisional application No. 60/724,898, filed on Oct. 11, 2005.

(51) Int. Cl.
*H04J 3/06* (2006.01)
(52) U.S. Cl. .................. 370/509; 370/529; 375/365
(58) Field of Classification Search .................. 370/474, 370/509, 522, 529
See application file for complete search history.

(56) References Cited

U.S. PATENT DOCUMENTS

| | | | |
|---|---|---|---|
| 5,602,595 A | 2/1997 | Citta et al. | |
| 5,677,911 A | 10/1997 | Fimoff et al. | |
| 6,298,100 B1 | 10/2001 | Bouillet | |
| 6,331,989 B1 | 12/2001 | Tezuka | |
| 6,785,733 B1 | 8/2004 | Mimura et al. | |
| 6,810,084 B1 | 10/2004 | Jun et al. | |

(Continued)

FOREIGN PATENT DOCUMENTS

CN    1497918 A    5/2004

(Continued)

OTHER PUBLICATIONS

Chinese Office Communication dated Dec. 11, 2009 issued in counterpart application No. 2006-80017764.5.

(Continued)

*Primary Examiner* — Andrew Lee
(74) *Attorney, Agent, or Firm* — Sughrue Mion, PLLC

(57) ABSTRACT

A method of formatting a digital broadcast transport stream packet, a digital broadcast transmitter, and a signal processing method thereof, includes constructing a transport stream packet that includes a stuffing region for an insertion of a known supplementary reference signal (SRS) data therein, randomizing the packet that includes the stuffing region is randomized, and the SRS data is inserted into the stuffing region of the randomized packet. Adding a parity for an error correction to the packet into which the SRS data has been inserted, the packet to which the parity has been added is interleaved, and a trellis encoding of the interleaved packet is performed. Inserting a segment sync signal and a field sync signal into the trellis-encoded packet, and a vestigial side band (VSB) modulation and an RF conversion of the packet are performed to transmit the VSB-modulated and RF-converted packet.

19 Claims, 13 Drawing Sheets

U.S. PATENT DOCUMENTS

| | | | |
|---|---|---|---|
| 7,738,581 | B2 | 6/2010 | Park et al. |
| 7,752,528 | B2 | 7/2010 | Park et al. |
| 2002/0126222 | A1 | 9/2002 | Choi et al. |
| 2002/0194570 | A1 | 12/2002 | Birru et al. |
| 2003/0021341 | A1* | 1/2003 | Vigil et al. ............... 375/240.01 |
| 2003/0223519 | A1 | 12/2003 | Jeong et al. |
| 2004/0148642 | A1 | 7/2004 | Park et al. |
| 2005/0213499 | A1* | 9/2005 | Boyce ........................... 370/222 |
| 2005/0281294 | A1 | 12/2005 | Gaddam et al. |
| 2007/0033475 | A1 | 2/2007 | Park et al. |
| 2007/0253502 | A1 | 11/2007 | Park et al. |
| 2009/0103647 | A1 | 4/2009 | Park et al. |
| 2009/0103657 | A1 | 4/2009 | Park et al. |
| 2009/0103660 | A1 | 4/2009 | Park et al. |
| 2009/0116580 | A1 | 5/2009 | Park et al. |

FOREIGN PATENT DOCUMENTS

| | | |
|---|---|---|
| EP | 1501222 A2 | 1/2005 |
| JP | 2002374430 A | 12/2002 |
| JP | 2005-064574 A | 3/2005 |
| JP | 2007-519359 A | 7/2007 |
| JP | 2008-503915 A | 2/2008 |
| JP | 2010-081631 A | 4/2010 |
| KR | 2005-35236 | 4/2005 |
| RU | 2117411 C1 | 8/1998 |
| WO | WO 01/78404 | 10/2001 |
| WO | 02085014 A1 | 10/2002 |
| WO | WO 02/080528 | 10/2002 |
| WO | WO 2004/023818 A1 | 3/2004 |
| WO | 2005043916 A1 | 5/2005 |
| WO | 2005071958 A1 | 8/2005 |
| WO | 2006/001635 A1 | 1/2006 |

OTHER PUBLICATIONS

"A syntax structure of MPEG-2 transport layer and an implementation technique of transmission multiplexer", Jun Li etc., Televisions Technology, vol. 3 of 1998, pp. 17-18, Dec. 31, 1998.

Russian Notice of Allowance dated Nov. 26, 2009 issued in counterpart application No. 2007-143323.

Lokshin B.A. "Digital broadcasting from a studio to a TV viewer", Sairus Systems, Moscow, 2001, pp. 148-152, 177-181.

Office Action issued by Russian Patent Office in Russian Patent Application No. 2007143323/09(047448) on Jan. 15, 2009.

Office Action issued by Russian Patent Office in Russian Patent Application No. 2007143323/09(047448) on Jun. 2, 2009.

Lee et al: "ATSC Terrestrial Digital Television Broadcasting Using Single Frequency Networks" ETRI Journal, vol. 26, No. 2 , Apr. 2004, pp. 92-100.

Search Report dated Jun. 22, 2010 from the European Patent Office in counterpart application 06768530.5.

Search Report issued in Korean International Patent Application No. PCT/KR2006/001873 on Sep. 27, 2006.

Written Opinion issued in Korean International Patent Application No. PCT/KR2006/001873 on Sep. 27, 2006.

Korean Office Action issued on May 8, 2007, in Korean Patent Application No. 2006-45063 (in Korean).

Office Action issued on Dec. 21, 2007 from the Korean Intellectual Property Office with respect to Korean Patent Application No. 2006-45063.

U.S. Appl. No. 11/416,204, filed May 3, 2006, Eui-jun Park et al., Samsung Electronics Co., Ltd.

U.S. Appl. No. 12/249,216, filed Oct. 10, 2008, Eui-jun Park et al., Samsung Electronics Co., Ltd.

U.S. Appl. No. 12/249,234, filed Oct. 10, 2008, Eui-jun Park et al., Samsung Electronics Co., Ltd.

Japanese Office Action, dated Nov. 24, 2011, issued in Application No. 2008-513360.

Japanese Office Action, dated Nov. 30, 2010, issued in Application No. 2009-233603.

* cited by examiner

FIG. 5A

MPEG TS PACKET INCLUDING ADAPTATION FIELD

| SYNC | PID | AF Header | SRS | Normal Stream |
|------|-----|-----------|-----|---------------|
| 1 | 3 | 2 | N | 182-N |

FIG. 5B

| SYNC | PID | AF Header | PCR or OPCR | SRS | Normal Stream |
|------|-----|-----------|-------------|-----|---------------|
| 1 | 3 | 2 | 6 | N-6 | 182-N |

FIG. 5C

| SYNC | PID | AF Header | Private data | SRS | Normal Stream |
|---|---|---|---|---|---|
| 1 | 3 | 2 | 5 | N-5 | 182-N |

FIG. 5D

| SYNC | PID | AF Header | Adaptation field extension | SRS | Normal Stream |
|---|---|---|---|---|---|
| 1 | 3 | 2 | 2 | N-2 | 182-N |

FIG. 5E

| SYNC | PID | AF Header | Splice count | SRS | Normal Stream |
|---|---|---|---|---|---|
| 1 | 3 | 2 | 1 | N−1 | 182-N |

FIG. 7A

| | | | ←――― 187 bytes ―――→ | |
|---|---|---|---|---|
| 1 | PID(3) | AF header(2) | SRS(k=10,20,27) | Payload |
| 2 | PID | AF header | SRS(k=10,20,27) | Payload |
| 3 | PID | AF header | SRS(k=10,20,27) | Payload |
| 4 | PID | AF header | SRS(k=10,20,27) | Payload |
| 5 | PID | AF header | SRS(k=10,20,27) | Payload |
| 6 | PID | AF header | SRS(k=10,20,27) | Payload |
| 7 | PID | AF header | SRS(k=10,20,27) | Payload |
| 8 | PID | AF header | SRS(k=10,20,27) | Payload |
| 9 | PID | AF header | SRS(k=10,20,27) | Payload |
| 10 | PID | AF header | SRS(k=10,20,27) | Payload |
| 11 | PID | AF header | SRS(k=10,20,27) | Payload |
| 12 | PID | AF header | SRS(k=10,20,27) | Payload |
| .. | PID | AF header | SRS(k=10,20,27) | Payload |
| .. | PID | AF header | SRS(k=10,20,27) | Payload |
| 52n+15,n=0  15 | PID | AF header | PCR(6)　　SRS(k=4,14,21) | Payload |
| .. | PID | AF header | SRS(k=10,20,27) | Payload |
| 52n+19,n=0  19 | PID | AF header | splice_count(1)　SRS(k=9,19,26) | Payload |
| .. | PID | AF header | SRS(k=10,20,27) | Payload |
| 52n+15,n=1  67 | PID | AF header | OPCR(6)　　SRS(k=4,14,21) | Payload |
| .. | PID | AF header | SRS(k=10,20,27) | Payload |
| 52n+19,n=1  71 | PID | AF header | splice_count(1)　SRS(k=9,19,26) | Payload |
| .. | PID | AF header | SRS(k=10,20,27) | Payload |
| 52n+15,n=2  119 | PID | AF header | Adaptation field extension(2)　SRS(k=8,18,25) | Payload |
| .. | PID | AF header | SRS(k=10,20,27) | Payload |

FIG. 7B

| | | | | | |
|---|---|---|---|---|---|
| 52n+19,n=2 | 123 | PID | AF header | splice_count(1) | SRS(k=9,19,26) | Payload |
| | ... | PID | AF header | | SRS(k=10,20,27) | Payload |
| 52n+15,n=3 | 171 | PID | AF header | length(1) | private data(5) | SRS(k=4,14,21) | Payload |
| | ... | PID | AF header | | SRS(k=10,20,27) | Payload |
| 52n+19,n=3 | 175 | PID | AF header | splice_count(1) | SRS(k=9,19,26) | Payload |
| | ... | PID | AF header | | SRS(k=10,20,27) | Payload |
| 52n+15,n=4 | 223 | PID | AF header | length(1) | private data(5) | SRS(k=4,14,21) | Payload |
| | ... | PID | AF header | | SRS(k=10,20,27) | Payload |
| 52n+19,n=4 | 227 | PID | AF header | splice_count(1) | SRS(k=9,19,26) | Payload |
| | ... | PID | AF header | | SRS(k=10,20,27) | Payload |
| 52n+15,n=5 | 275 | PID | AF header | length(1) | private data(5) | SRS(k=4,14,21) | Payload |
| | ... | PID | AF header | | SRS(k=10,20,27) | Payload |
| 52n+19,n=5 | 279 | PID | AF header | splice_count(1) | SRS(k=9,19,26) | Payload |
| | ... | PID | AF header | | SRS(k=10,20,27) | Payload |
| | 302 | PID | AF header | | SRS(k=10,20,27) | Payload |
| | 303 | PID | AF header | | SRS(k=10,20,27) | Payload |
| | 304 | PID | AF header | | SRS(k=10,20,27) | Payload |
| | 305 | PID | AF header | | SRS(k=10,20,27) | Payload |
| | 306 | PID | AF header | | SRS(k=10,20,27) | Payload |
| | 307 | PID | AF header | | SRS(k=10,20,27) | Payload |
| | 308 | PID | AF header | | SRS(k=10,20,27) | Payload |
| | 309 | PID | AF header | | SRS(k=10,20,27) | Payload |
| | 310 | PID | AF header | | SRS(k=10,20,27) | Payload |
| | 311 | PID | AF header | | SRS(k=10,20,27) | Payload |
| | 312 | PID | AF header | | SRS(k=10,20,27) | Payload |

METHOD FOR FORMATTING DIGITAL BROADCAST TRANSPORT STREAM PACKET FOR IMPROVED RECEIVING PERFORMANCE, DIGITAL BROADCAST TRANSMITTER, AND SIGNAL PROCESSING METHOD THEREOF

CROSS-REFERENCE TO RELATED APPLICATION

This application is a continuation of U.S. application Ser. No. 11/416,204, filed on May 3, 2006, now pending, which claims benefit of U.S. Provisional Patent Application No. 60/683,304 filed on May 23, 2005 and U.S. Provisional Patent Application No. 60/724,898 filed on Oct. 11, 2005 in the United States Patent and Trademark Office, the disclosures of which are incorporated herein by reference.

BACKGROUND OF THE INVENTION

1. Field of the Invention

Aspects of the present invention relate to a method for formatting a digital broadcast transport stream packet, a digital broadcast transmitter, and a signal processing method thereof, and more particularly to a method of formatting a digital broadcast transport stream packet, a digital broadcast transmitter, and a signal processing method thereof, which can improve the receiving performance of a receiving system and maintain the compatibility with the existing system by generating an adaptation field in a transport stream packet and inserting known data (i.e., supplementary reference sequence (hereinafter referred to as "SRS")) into the position of the adaptation field.

2. Description of the Related Art

An Advanced Television Systems Committee (ATSC) Vestigial Side Band (VSB) system that is an American-type digital terrestrial broadcasting system is a signal carrier type broadcasting system, and uses a field sync signal in the unit of 312 segments. FIG. 1 is a block diagram illustrating the construction of a transmitter/receiver of an ATSC DTV standard as a general American-type digital terrestrial broadcasting system. The digital broadcast transmitter of FIG. 1 includes a randomizer 110 for randomizing a Moving Picture Experts Group-2 (MPEG-2) transport stream (TS), a Reed-Solomon (RS) encoder 120 for adding RS parity bytes to the transport stream (TS) in order to correct bit errors occurring due to the channel characteristic in a transport process. An interleaver 130 interleaves the RS-encoded data according to a specified pattern. A trellis encoder 140 maps the interleaved data onto 8-level symbols by performing a trellis encoding of the interleaved data at the rate of ⅔. The digital broadcast transmitter performs error correction coding of the MPEG-2 transport stream.

The digital broadcast transmitter further includes a multiplexer 150 to insert a segment sync signal and a field sync signal into the error-correction-coded data. A modulator/RF converter 160 inserts a pilot tone into the data symbols into which the segment sync signal and the field sync signal are inserted by inserting specified DC values into the data symbols, performs a VSB modulation of the data symbols by pulse-shaping the data symbols, and up-converts the modulated data symbols into an RF channel band signal to transmit the RF channel band signal.

Accordingly, the digital broadcast transmitter randomizes the MPEG-2 transport stream, outer-codes the randomized data through the RS encoder 120 that is an outer coder, and distributes the coded data through the interleaver 130. Also, the digital broadcast transmitter inner-codes the interleaved data in the unit of 12 symbols through the trellis encoder 140, performs the mapping of the inner-coded data onto the 8-level symbols, inserts the field sync signal and the segment sync signal into the coded data, performs the VSB modulation of the data by inserting a pilot tone into the data, and then up-converts the modulated data into the RF signal to output the RF signal.

Meanwhile, the digital broadcast receiver of FIG. 1 includes a tuner (not illustrated) for down-converting an RF signal received through a channel into a baseband signal. A demodulator 220 performs a sync detection and demodulation of the converted baseband signal. An equalizer 230 compensates for a channel distortion of the demodulated signal occurring due to a multi-path transmission. A trellis decoder 240 corrects errors of the equalized signal and decodes the equalized signal to symbol data. A deinterleaver 250 rearranges the data distributed by the interleaver 130 of the digital broadcast transmitter. An RS decoder 260 corrects errors, and derandomizer 270 derandomizes the data corrected through the RS decoder 260 and outputs an MPEG-2 transport stream.

Accordingly, the digital broadcast receiver of FIG. 1 down-converts the RF signal into the baseband signal, demodulates and equalizes the converted signal, and then channel-decodes the demodulated signal to restore to the original signal.

FIG. 2 illustrates a VSB data frame for use in the American type digital broadcasting (8-VSB) system, into which a segment sync signal and a field sync signal are inserted. As shown in FIG. 2, one frame is composed of two fields. One field is composed of one field sync segment that is the first segment, and 312 data segments. Also, one segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed in the receiver side.

As shown in FIG. 1, the VSB system of the American type digital terrestrial broadcasting system is a single carrier system, and thus has the drawback in that it is weak in a multi-path fading channel environment having the Doppler effect. Accordingly, the performance of the receiver is greatly influenced by the performance of the equalizer for removing the multi-path fading. However, according to the existing transport frame as shown in FIG. 2, since the field sync signal that is the reference signal of the equalizer appears once for every 313 segments, its frequency is quite low with respect to one frame signal, and this causes the performance of equalization to deteriorate.

That is, it is not easy for the existing equalizer to estimate the channel using a small amount of data as above and to equalize the received signal by removing the multi-path fading. Accordingly, the conventional digital broadcast receiver has the disadvantages that its receiving performance deteriorates in an inferior channel environment, and especially in a Doppler fading channel environment.

SUMMARY OF THE INVENTION

An aspect of the present invention is to provide a method for formatting a digital broadcast transport stream packet, and a signal processing method for a digital broadcast transmitter, which can maintain the compatibility with the existing digital broadcast transmitting/receiving system.

Additional aspects and/or advantages of the invention will be set forth in part in the description which follows and, in part, will be obvious from the description, or may be learned by practice of the invention.

The foregoing and other objects and/or advantages are substantially realized by providing a method for formatting a digital broadcast transport stream (TS) packet including a header and a payload which comprises inserting known supplementary reference sequence (SRS) data into the packet.

According to an aspect of the invention, the packet further includes an adaptation field, and the SRS data inserted into at least a portion of the adaptation field.

According to an aspect of the invention, the adaptation field includes an option field selectively included, and the SRS data is inserted into at least a portion of the adaptation field except for the option field.

According to an aspect of the invention, the option field is at least one of a program clock reference (PCR), an original program clock reference (OPCR), a splice countdown, a transport private data length, and an adaptation field extension length, or combinations thereof.

According to an aspect of the invention, the SRS signal is used for a synchronization and/or a channel equalization.

In another aspect of the present invention, there is provided a digital broadcast transmitter, which comprises a packet construction unit for constructing a transport stream packet that includes a stuffing region for an insertion of a known supplementary reference signal (SRS) data therein; a randomizer for randomizing the packet that includes the stuffing region; an SRS insertion unit for inserting the SRS data into the stuffing region of the randomized packet; a Reed-Solomon (RS) encoder for adding a parity for an error correction to the packet into which the SRS data has been inserted; an interleaver for interleaving packet to which the parity has been added; a trellis encoder for performing a trellis encoding of the interleaved packet; a multiplexer for inserting a segment sync signal and a field sync signal into the trellis-encoded packet; and a modulator/RF converter for performing a vestigial side band (VSB) modulation and an RF conversion of an output signal of the multiplexer to transmit the VSB-modulated and RF-converted signal.

In still another aspect of the present invention, there is provided a signal processing method for a digital broadcast transmitter, which comprises constructing a transport stream packet that includes a stuffing region for an insertion of a known supplementary reference signal (SRS) data therein; randomizing the packet that includes the stuffing region; inserting the SRS data into the stuffing region of the randomized packet; adding a parity for an error correction to the packet into which the SRS data has been inserted; interleaving packet to which the parity has been added; performing a trellis encoding of the interleaved packet; inserting a segment sync signal and a field sync signal into the trellis-encoded packet; and performing a vestigial side band (VSB) modulation and an RF conversion of the packet to transmit the VSB-modulated and RF-converted packet.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 5A to 5E are views illustrating diverse data formats of an MPEG-2 transport stream packet that includes an adaptation field to which stuff bytes are added according to aspects of the present invention;

FIGS. 7A and 7B are a view illustrating an input type of an MPEG packet according to an aspect of the present invention;

DETAILED DESCRIPTION OF THE EMBODIMENTS

Figure 1:
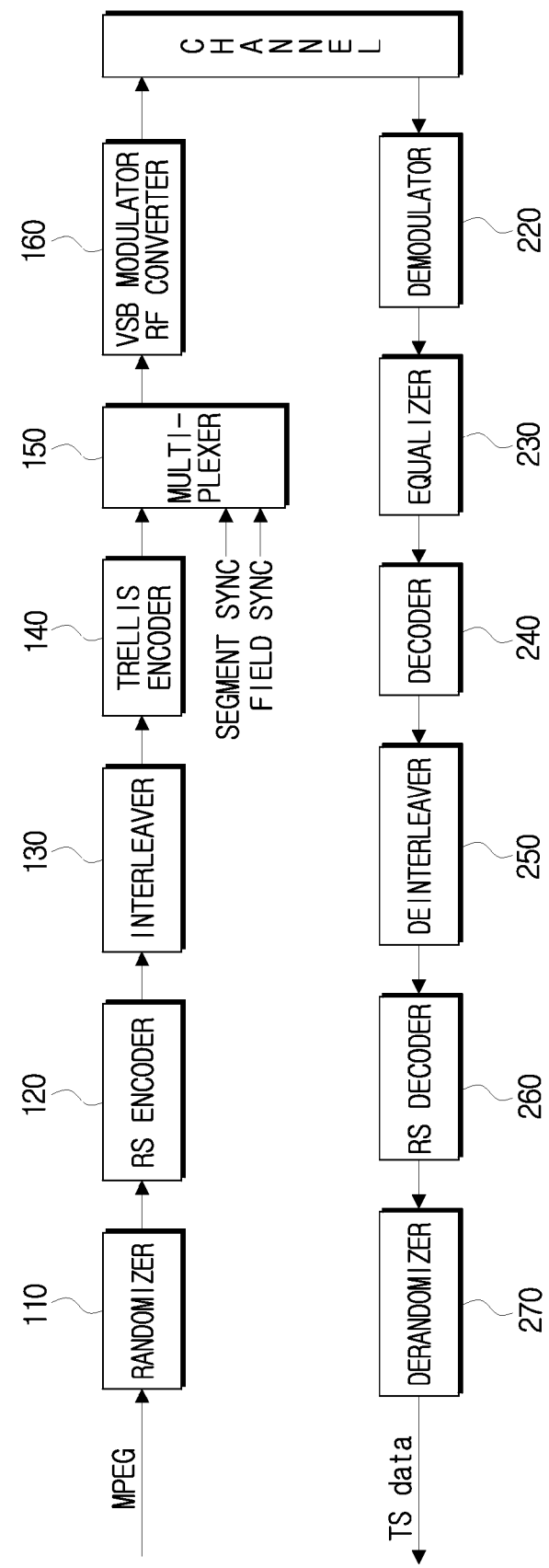
FIG. 1 is a block diagram illustrating the construction of a conventional digital broadcast (ATSC VSB) transmitter/receiver.
Figure 2:
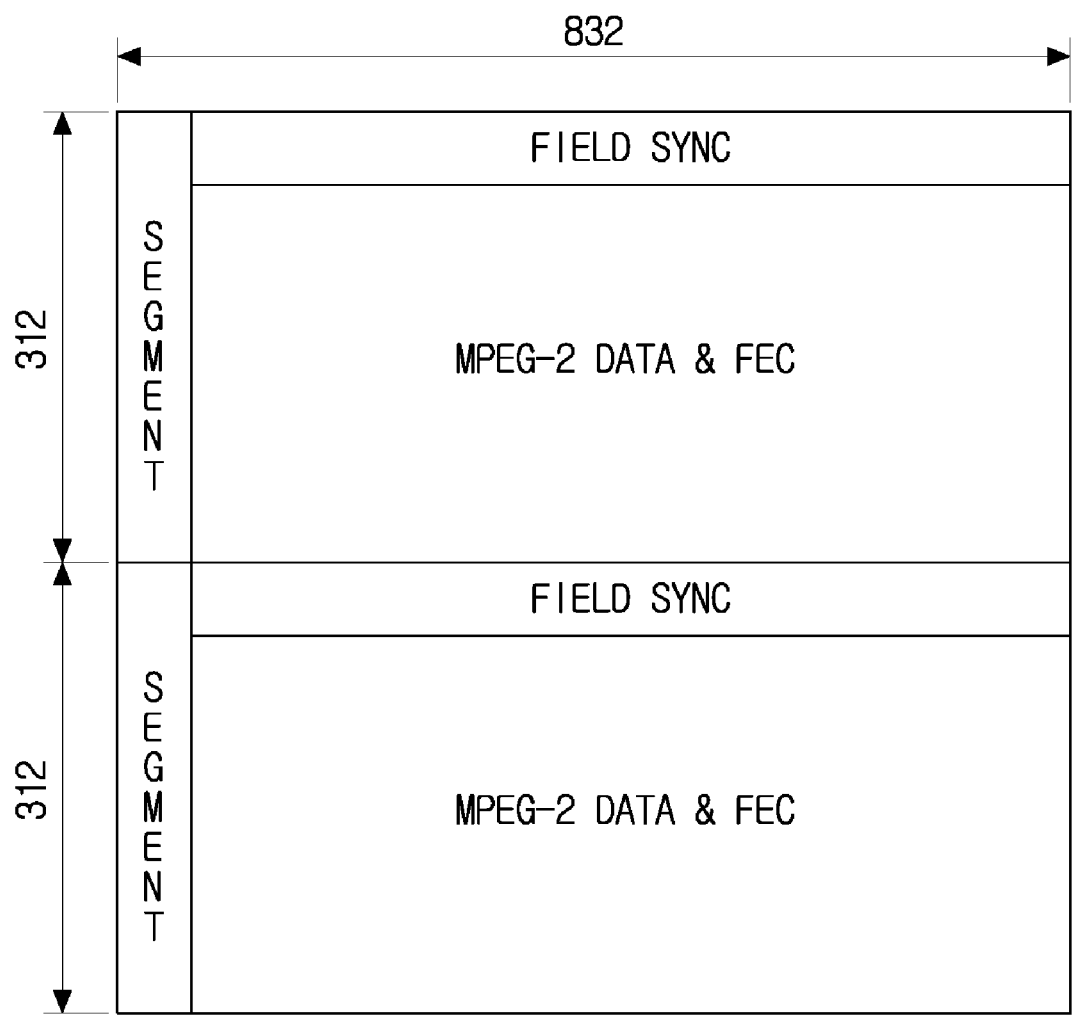
FIG. 2 is a view illustrating the structure of a conventional ATSC VSB data frame.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Also, well-known functions or constructions are not described in detail since they would obscure the invention in unnecessary detail.

Figure 3:
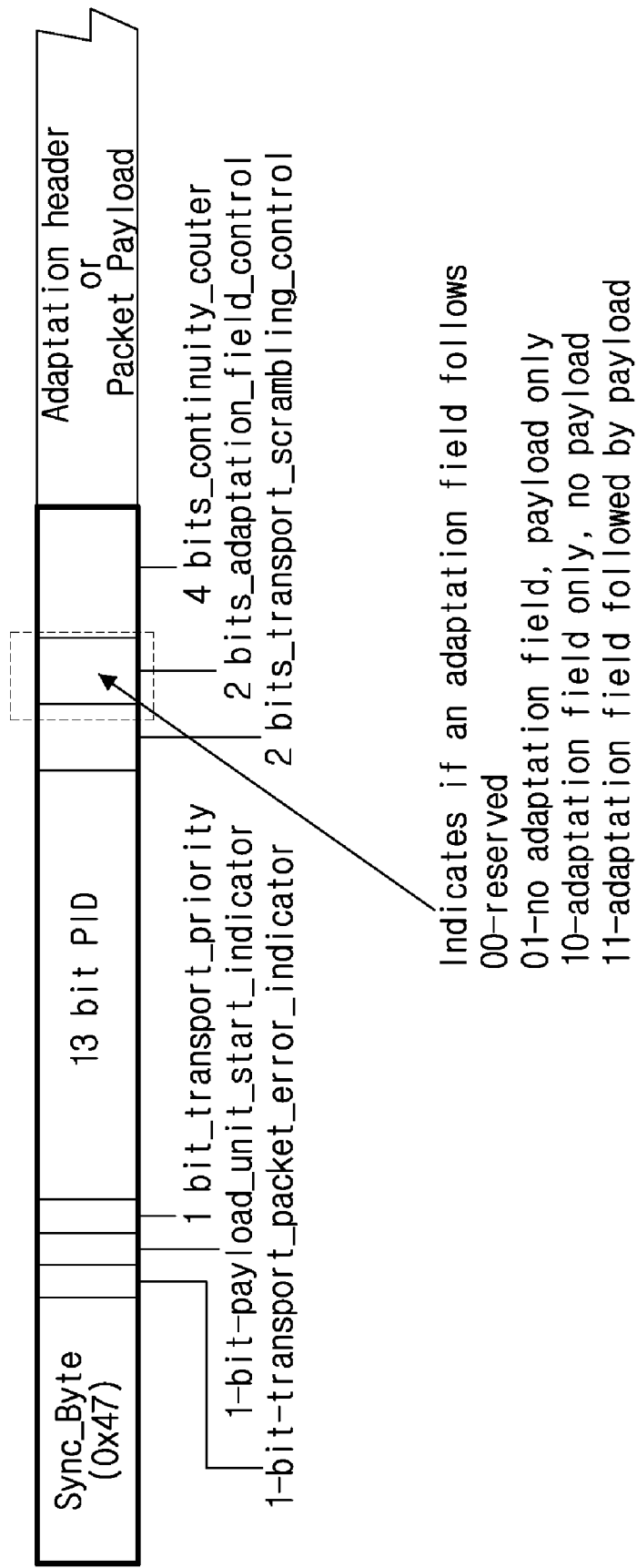
FIG. 3 is a view illustrating the structure of a transport stream packet.
Figure 4:
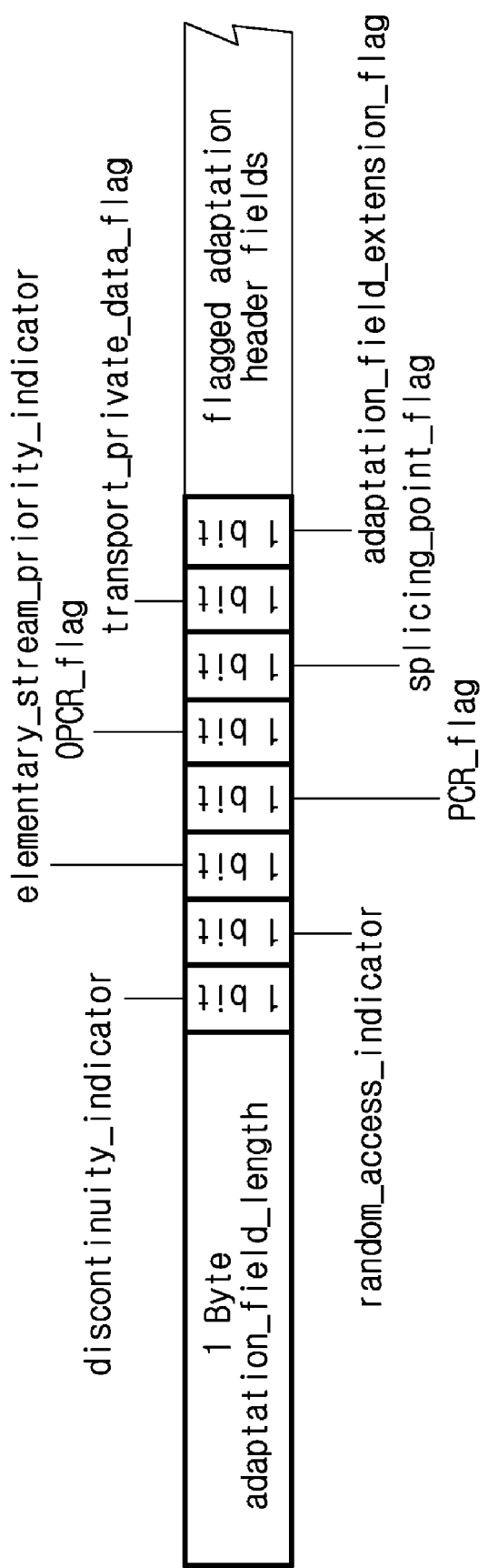
FIG. 4 is a view illustrating the structure of a header of an adaptation field of a transport stream.

FIGS. 3 and 4 illustrate the structure of an MPEG packet according to the standard of an MPEG system that is used in the ASTC Digital Television Standard. As illustrated in FIG. 3, the MPEG packet includes a Sync_Byte, a 1 bit transport packet error indicator, a 1 bit payload unit start indicator, a 1 bit transport priority flag, a 13 bit PID (Packet Identifier) value, a 2 bit transport scrambling control indicator, a 2 bit adaptation field control indicator, and 4 bit continuity counter. A payload and/or an adaptation field follows the shown 4 bit continuity counter.

As illustrated in FIG. 4, information such as a program clock reference (PCR), an original program clock reference (OPCR), a splice countdown, a transport private data length, and an adaptation field extension length, is transmitted in an MPEG packet using an option field such as an PCR, an POCR, a slice_point, a transport private data length, adaptation field data, and an adaptation field extension flag. Here, the option field may be the PCR that is used as a sync signal of a demodulator of a receiver, OPCR used for a recording, reservation, and playback of a program in the receiver, splice countdown that is the number of successive macroblocks each of which is composed of four circuit blocks, a Cr block, and a Cb block, transport private data length that is the length of text data of a text broadcast, and adaptation field extension length. Also shown is a 1 bit discontinuity indicator, a 1 bit random access indicator, a 1 bit elementary stream priority indicator, a 1 byte adaptation field length, and flagged adaptation head fields.

FIGS. 5a to 5e are views illustrating diverse formats of an MPEG-2 transport stream into which a supplementary reference sequence (SRS) is to be inserted in order to implement the transmitter according to an aspect of the present invention. Here, for convenience in explanation, three bytes after a sync byte of the transport stream are collectively called a normal header, and the first two bytes of the adaptation field are collectively called an adaptation field (AF) header. However, other names and/or numbers of bytes can be used.

Generally, the SRS is a special known sequence in a deterministic VSB frame that is inserted in such a way that a receiver equalizer can utilize this known sequence to mitigate dynamic multi-path and other adverse channel conditions. The equalizer of a receiver uses these contiguous sequences to adapt itself to a dynamically changing channel. When the encoder states have been forced to a known Deterministic State (DTR), an appended pre-calculated "known sequence" of bits (SRS pattern) is then processed immediately in a pre-determined way at specific temporal locations at the Interleaver input of the frame. The resulting symbols, at the Interleaver output, due to the way ATSC compatible Interleaver functions will appear as known contiguous symbol patterns in known locations in the VSB frame, which is available to the receiver as additional equalizer training sequence. The data to be used in the transport stream (TS) packets to create these known symbol sequence is introduced into the system in a backward compatible way using existing standard mechanisms. This data is carried in the MPEG2 adaptation field. Hence existing standards are leveraged, and compatibility is assured.

The RS Encoder preceding the Interleaver calculates the R-S parity. Due to resetting the TCM encoders, the calculated RS Parity bytes are wrong and need to be corrected. Thus an additional processing step is involved to correct parity errors in selected packets. All packets with parity errors will have their RS parity re-encoded. A (52) segment byte inter-leaver with unique time dispersion properties, that generates contiguous SRS pattern is leveraged to have adequate time to re-encode parity bytes. Required time to do this constraints the maximum number of SRS bytes.

FIG. 5a shows the structure of an MPEG-2 packet data of a basic form in a VSB system using an SRS. This MPEG-2 packet data includes a normal header part composed of a one-byte sync signal and a three-byte PID (Packet Identity), a two-byte adaptation field (AF) header including information about the position of the stuff bytes, and stuff bytes of a specified length N. The remaining bytes of the packet data correspond to a normal stream that is typical payload data. Since the start position of the stuff bytes is fixed, the information about the byte position is expressed by information about the length of the stuff bytes. The stuff-byte length N may be in the range of 1 to 27.

FIGS. 5b to 5e illustrate packet structures having adaptation fields in which other information such as a program clock reference (PCR), an original program clock reference (OPCR), a splice countdown (splice_count), and others, are included in order to effectively use the SRS. In these cases, the adaptation field is constructed to have a uniform size. A part except for the AF header and information such as PCR, OPCR, splice_count, and others, corresponds to the stuff bytes to which the SRS is to be inserted. It is understood that, in addition to the packet structures shown in FIGS. 5b through 5e, there are multiple ways in which to construct a transport stream packet having a stuff region into which the SRS is inserted in an area other than an area for the option field of the adaptation field according to aspects of the invention.

Figure 6A:
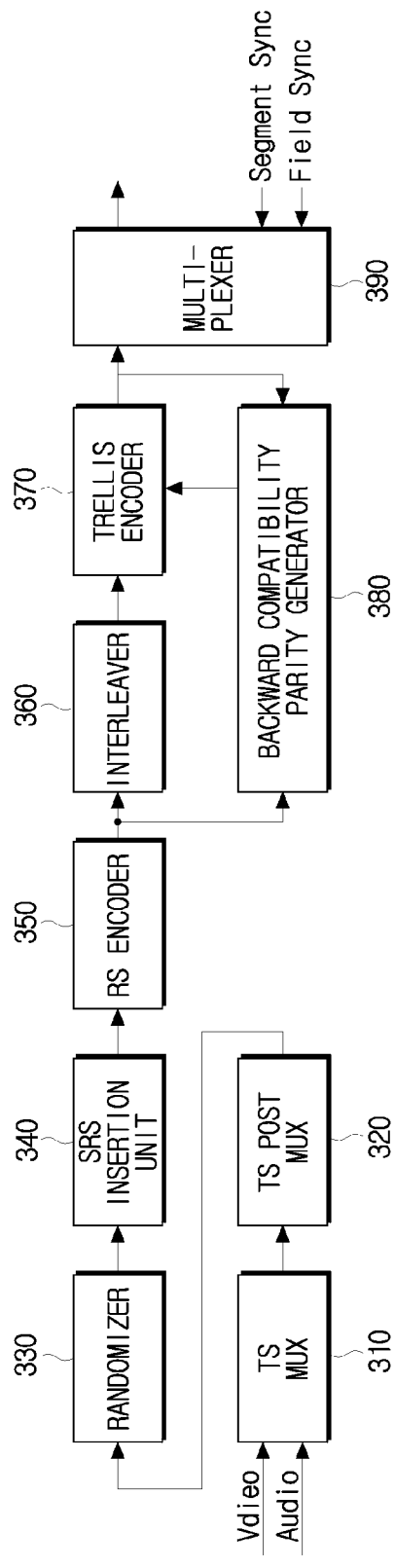
FIG. 6a is a block diagram illustrating the construction of a digital broadcast transmitter according to an embodiment of the present invention.

FIG. 6a is a block diagram illustrating the construction of a digital broadcast transmitter according to an embodiment of the present invention. Referring to FIG. 6a, the digital broadcast transmitter includes a TS multiplexer (MUX) 310, a TS post multiplexer (MUX) 320, a randomizer 330, an SRS insertion unit 340, an RS encoder 350, a data interleaver 360, a trellis encoder 370, a backward compatibility parity generator 380, and a multiplexer 390. The TS MUX 310 receives a video stream and an audio stream, and constructs the existing MPEG transport stream packet. The TS post MUX 320 forms a stuff region for inserting SRS data into the transport stream packet output from the TS MUX 310, and outputs the MPEG transport stream. Examples of the stream are shown in FIGS. 5a to 5e (but not limited to) by properly moving positions such as the PCR, OPCR, slice countdown, transport private data length, adaptation field extension length, and other like data.

The randomizer 330 randomizes the input MPEG-2 transport stream data in order to heighten the utility of the allocated channel space. The SRS insertion unit 340 generates the SRS. The SRS is a specified sequence (such as a training sequence) having a specified pattern prearranged between the transmitter side and the receiver side. The SRS insertion unit 340 replaces the stuff bytes in the stuff-byte position of the randomized data with the SRS. Since the SRS is distinguishable from the payload data, the pattern of which is transmitted/received, the SRS can be easily detected and used for the synchronization and the equalization at the receiver side.

The RS encoder 350 adds a parity of specified bytes to the packet when the stuff bytes are exchanged in the packet by the SRS insertion unit 340 by performing an RS encoding of the packet data in order to correct errors occurring due to the channel. The interleaver 360 interleaves the data packet, to which the parity output from the RS encoder 350 is added, in a specified pattern. The trellis encoder 370 converts the data output from the interleaver 360 into data symbols, and performs a symbol mapping of the data symbols through a trellis encoding at a ⅔ rate.

According to an aspect of the invention, the trellis encoder 370 initializes the value temporarily stored in its own memory device to a specified value. For example, the initialized value can be a "00" state. Whatever the value, the initialization is at a start point of the SRS. The trellis encoder 370 performs the trellis encoding of the data. Also, the trellis encoder 370 outputs a value for initializing the memory to the backward compatibility parity generator 380, receives a new parity generated by the backward compatibility parity generator 380, and replaces the corresponding existing parity with the received new parity such that the trellis encoding is performed with the new parity received from the backward compatibility parity generator 380.

The output of the trellis encoder 370 and the next memory state are affected by the previous memory value. That is, if the previous input is changed, an input to be used for the initialization is changed. If the parity of the packet corresponding to the initialization area precedes the initialization area, the input value previously used to initialize the memory of the trellis encoder 370 is changed due to the newly generated parity. In this case, the initialization may not be performed, or an accurate parity cannot be generated using the corrected initialization value. Accordingly, in order to prevent the parity of the initialization packet from preceding the initialization area, according to an aspect of the invention the maximum number of used stuff bytes becomes 27 according to an aspect of the invention. However, it is understood that, for other types of packets divided into other numbers of segments, other maximum numbers of used stuff bytes can be imposed.

According to an aspect of the invention, the backward compatibility parity generator 380 generates the new parity by performing an RS encoding of the MPEG-2 packet input from the RS encoder 360 (i.e., re-RS encodes the RS encoded MPEG-2 packet) using the memory initializing value input from the trellis encoder 370. The backward compatibility parity generator 380 transmits the generated parity to the trellis encoder 370. It is understood, however, that if backward compatibility is not need, the generator 380 need not be included.

The MUX 390 multiplexes the trellis-encoded packet, the segment sync signal, and the field sync signal by inserting the segment sync signal and the field sync signal into the trellis-encoded packet. The modulator (not illustrated) performs a VSB modulation of the packet into which the segment sync signal and the field sync signal have been inserted, and performs an up-converting of the modulated packet into an RF channel band signal to transmit the RF channel band signal.

Figure 6B:
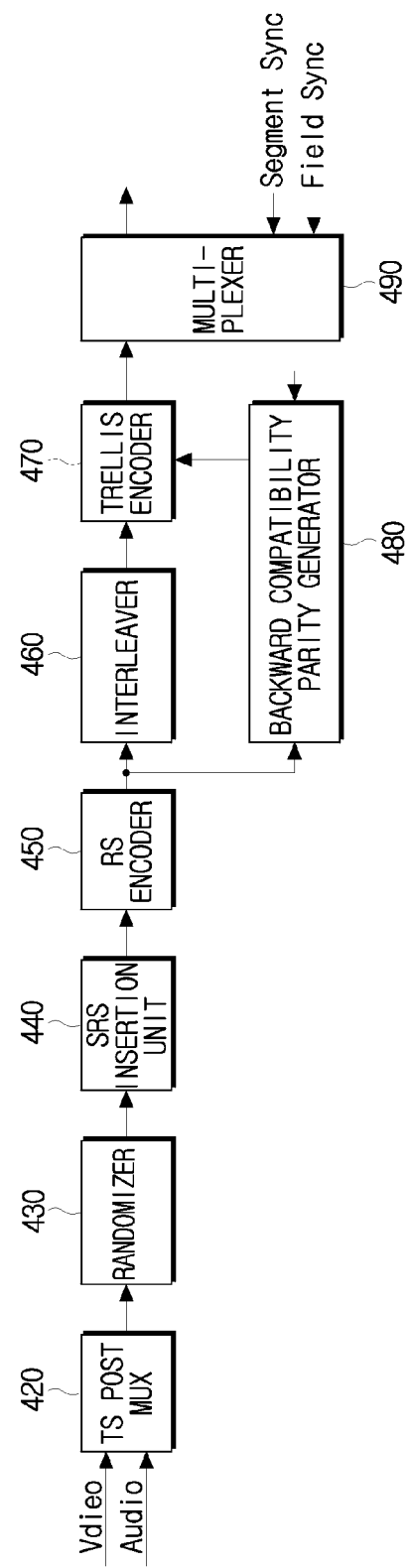
FIG. 6b is a block diagram illustrating the construction of a digital broadcast transmitter according to another embodiment of the present invention.

FIG. 6b is a block diagram illustrating the construction of a digital broadcast transmitter according to another embodiment of the present invention. In this embodiment, a TS post MUX 420 directly receives audio and video inputs without passing through a TS MUX, and performs the same operation as the construction of FIG. 6a. In this case, the TS post MUX 420 is not added to the TS MUX for the SRS VSB, but is considered as a new TS MUX for the SRS VSB.

Consistent with FIG. 6a, the randomizer 430 randomizes the input MPEG-2 transport stream data in order to heighten the utility of the allocated channel space. The SRS insertion unit 440 generates the SRS that is a specified sequence having a specified pattern prearranged between the transmitter side and the receiver side, and replaces the stuff bytes in the stuff-byte position of the randomized data by the SRS. The RS encoder 450 adds a parity of specified bytes to the packet of which the stuff bytes are exchanged by the SRS insertion unit 340 by performing an RS encoding of the packet data in order to correct errors occurring due to the channel. The interleaver 460 interleaves the data packet, to which the parity output from the RS encoder 350 is added, in a specified pattern. The trellis encoder 470 converts the data output from the interleaver 360 into data symbols, and performs a symbol mapping of the data symbols through a trellis encoding at a $\frac{2}{3}$ rate.

As shown, the trellis encoder 470 initializes the value temporarily stored in its own memory device to a specified value (for example, to a "00" state) at a start point of the SRS, and performs the trellis encoding of the data. Also, the trellis encoder 470 outputs a value for initializing the memory to the backward compatibility parity generator 480, receives a new parity generated by the backward compatibility parity generator 380, and replaces the corresponding existing parity by the received new parity.

The output of the trellis encoder and the next memory state are affected by the previous memory value. That is, if the previous input is changed, an input to be used for the initialization is changed. If the parity of the packet corresponding to the initialization area precedes the initialization area, the input value previously used to initialize the memory of the trellis encoder 470 is changed due to the newly generated parity. In this case, the initialization may not be performed, or an accurate parity cannot be generated using the corrected initialization value. Accordingly, in order to prevent the parity of the initialization packet from preceding the initialization area, the maximum number of used stuff bytes becomes 27.

The backward compatibility parity generator 480 generates the parity by performing an RS encoding of the MPEG-2 packet input from the RS encoder 460 by using the memory initializing value input from the trellis encoder 470, and transmits the generated parity to the trellis encoder 470. However, it is understood that the generator 480 is not required in all aspects of the invention.

The MUX 490 multiplexes the trellis-encoded packet, the segment sync signal, and the field sync signal by inserting the segment sync signal and the field sync signal into the trellis-encoded packet. The modulator (not illustrated) performs a VSB modulation of the packet into which the segment sync signal and the field sync signal have been inserted, and performs an up-converting of the modulated packet into an RF channel band signal to transmit the RF channel band signal.

FIGS. 7A and 7B are a view illustrating an example input type of an MPEG packet, whereby the SRS VSB can be efficiently operated, according to aspects of the present invention. 312 MPEG packets are contained in one VSB field. The packets that include information such as PCR, OPCR, splice countdown, transport private data length, and adaptation field extension length, among the 312 packets, can be input in specified positions as shown in the drawing. The position of the option field, for example, when 312 segments are divided in the unit of 52 segments, can be expressed as follows:

Program clock reference (PCR) (6 bytes used): 52n+15, n=0;

Original program clock reference (OPCR) (6 bytes used): 52n+15, n=1;

Adaptation field extension length (2 bytes used): 52n+15, n=2;

Transport private data length (5 bytes used): 52n+15, n=3, 4, 5; and

Splice countdown (1 byte used): 52n+19, n=0, 1, 2, 3, 4, 5.

The shape of an MPEG packet as shown in FIGS. 5A to 5E and the position of an MPEG packet as shown in FIGS. 7A and 7B can be modified in diverse forms in order to efficiently use the SRS VSB.

Figure 8A:
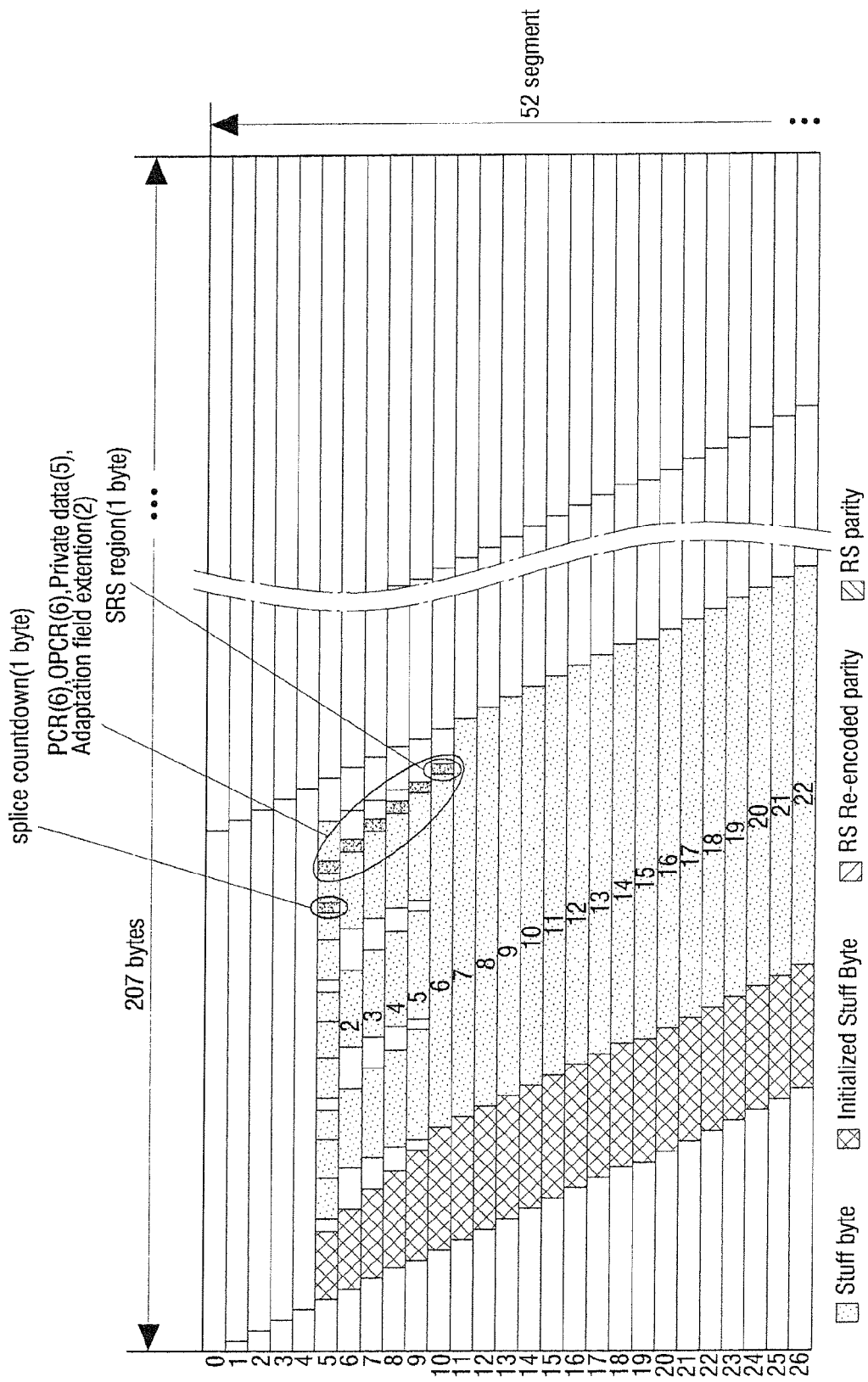
FIGS. 8A and 8B are an exemplary view illustrating the structure of an interleaved packet according to an embodiment of the present invention.
Figure 8B:
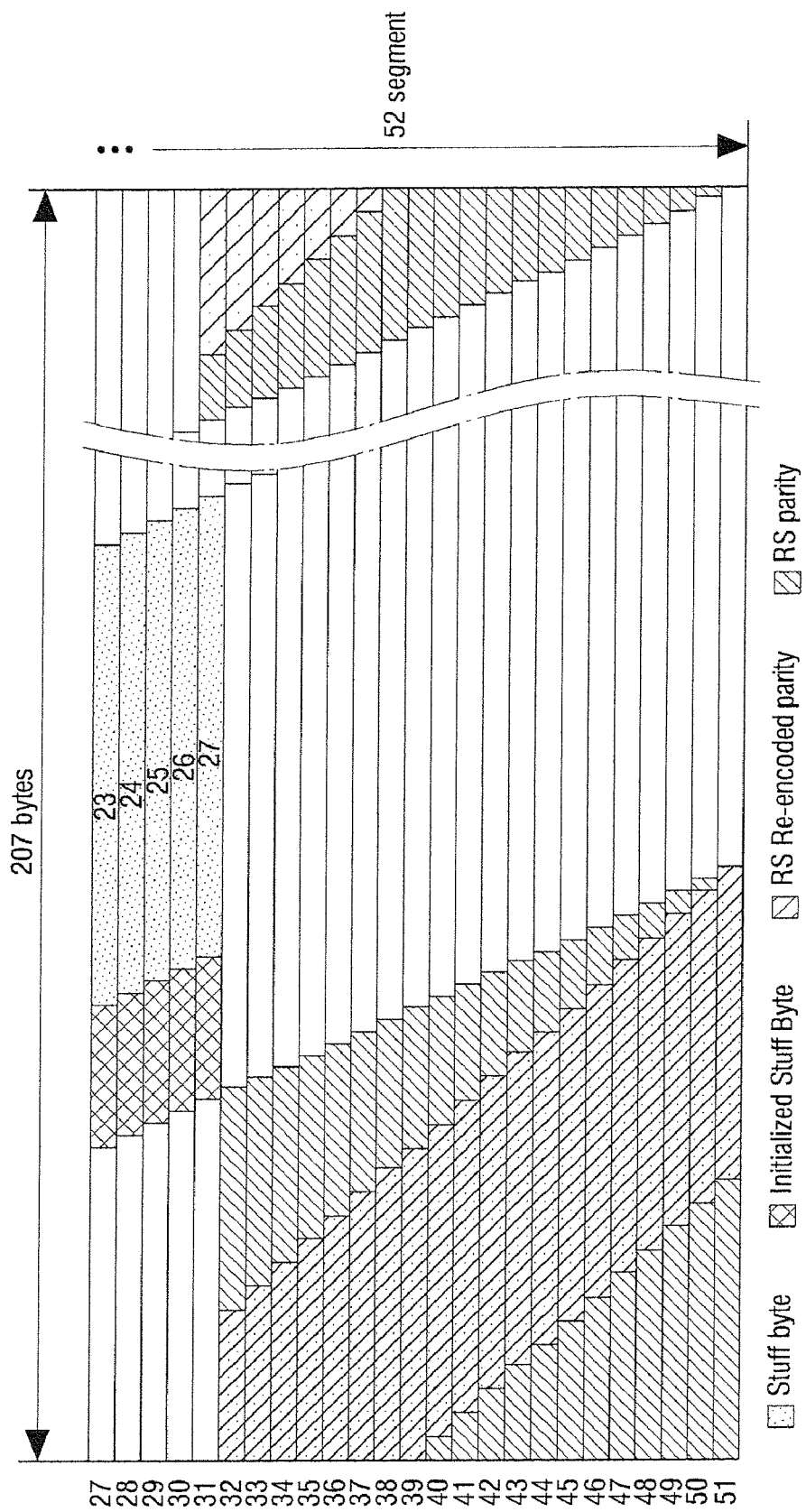

FIGS. 8A and 8B are an exemplary view illustrating the structure of an interleaved packet according to an embodiment of the present invention. Since MPEG information such as the PCR should be received as it is for the compatibility, it cannot be used for the initialization or SRS pattern. Accordingly, by transmitting the MPEG information using the transport stream part that does not initialize the trellis encoder 370, the loss can be reduced.

As shown in FIGS. 7A and 7B when PCR or OPCR is used in the position 52n+15, 5 bytes among 6 bytes of PCR or OPCR are used in empty parts where the known symbol is not used, and this causes a loss of the known symbols only for one byte (i.e., 4 symbols) without any training loss occurring. Also, in the case of transferring information less than 5 bytes, no loss of the known symbols occurs. In FIG. 7, the splice_count is transmitted in the position 52n+19. By transmitting the splice_count through the empty part where the known symbol is not used as shown in FIGS. 8A and 8B, the splice_count can be transmitted without any loss of the known symbols. In the case of using the MPEG packet having the above-described structure, the receiver uses the SRS region except for the OPCR and PCR regions as a training sequence, and particularly, known values for the equalizer (such as the equalizer 230) and/or the forward error correction decoder (such as the decoder 240).

Hereinafter, an embodiment of a method for compatibly operating the SRS VSB when no TS post MUX exists will be explained. When the MPEG packet is input to the data randomizer 330, the randomizer 330 judges whether an adaptation field exists using the adaptation field control flag of FIG. 3. As shown, the adaptation field control flag of FIG. 3 has a flag for reserved (00), a flag for no adaptation field, payload only (01), a flag for adaptation field only, no payload (10), and a flag adaptation field followed by payload (11). If the adaptation field exists, the data randomizer 330 judges whether the OPCR, splicing_point, transport_private_data, and adaptation_field_extension exist using the flag as shown in FIG. 4. If even one flag exists, it passes the corresponding packet without performing the stuff-byte replacement.

In this case, the trellis encoder 370 and the backward compatibility parity generator 380 of FIG. 6A process the packet in the existing VSB processing manner, without performing the RS re-encoding and the memory initialization of the training sequence. In this process, the packet carrying the information is not changed and thus can be transmitted without any distortion.

The transmitter can transmit, using a reserved part, information about the change of the training region by the transmission of such information to the receiver. Also, the receiver uses the information about the training region as the known values for the equalizer and the forward error correction by using the information as the training sequence.

Figure 9:
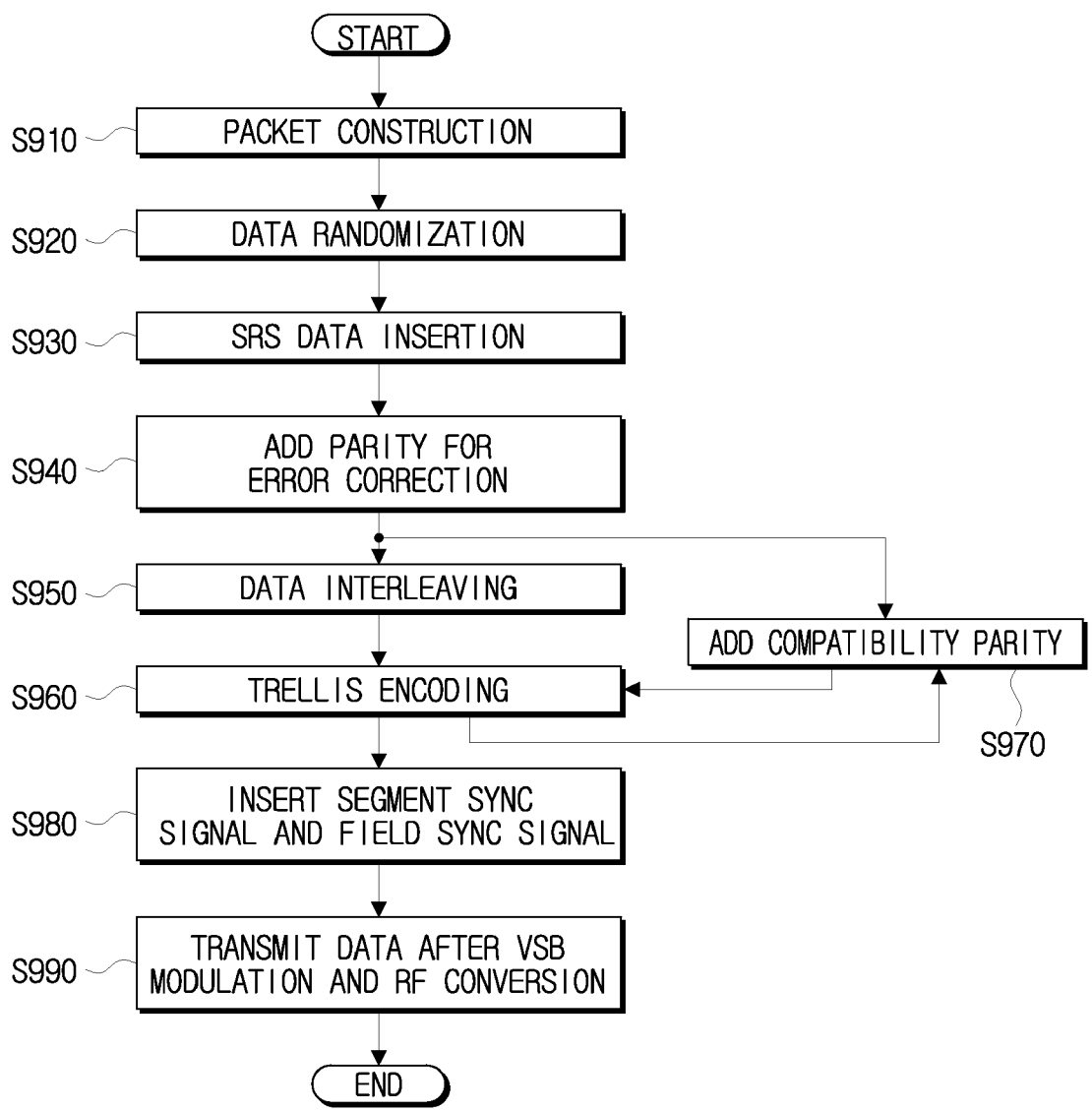
FIG. 9 is a flowchart illustrating a signal processing method for a digital broadcast transmitter according to an embodiment of the present invention.

FIG. 9 is a flowchart illustrating a signal processing method for a digital broadcast transmitter according to an embodiment of the present invention. Referring to FIGS. 6a and 9, the TS MUX 310 receives a video stream and an audio stream, and constructs the transport stream packets. The TS post MUX 320 constructs the transport stream packet that includes the stuffing region for the insertion of the known SRS data (S910). The randomizer 330 randomizes the packet that includes the stuffing region (S920). The SRS insertion unit 340 inserts the SRS signal into the stuffing region of the randomized packet (S930).

The RS encoder 350 adds the parity to the packet into which the SRS signal has been inserted in order to correct an error occurring due to the channel (S940). The interleaver 360 interleaves the packet to which the parity has been added (S950). The trellis encoder 370 initializes its own memory at a start position of the SRS signal, and performs a trellis encoding (S960). The backward parity generator 380 receives a packet to which the parity has been added through the RS encoder 350 in operation S940 and a packet encoded through the trellis encoder 370, and generates a compatibility parity on the basis of the packets (S970). The trellis encoder 370 receives the compatibility parity from the backward compatibility parity generator 380, replaces a part corresponding to the compatibility parity among the parities added by the RS encoder 350 by the generated compatibility parity, and uses this parity to perform the trellis encoding in operation S960.

The multiplexer 390 inserts the segment sync signal and the field sync signal into the trellis-encoded packet (S980), and the modulator performs a VSB modulation and an RF conversion of the packet to transmit the VSB-modulated and RF-converted packet (S990).

While described as a stream including audio and video, it is understood that the stream can include other data according to aspects of the invention.

As described above, according to aspects of the present invention, the receiving performance of the digital broadcast receiver can be improved even in an inferior multi-path channel by constructing an adaptation field that includes a stuff-byte region in an MPEG-2 transport stream packet, and inserting an SRS signal into the stuff-byte region in the digital broadcast transmitter, and by detecting the SRS signal from the received signal and using the detected SRS signal for the synchronization and the equalization in the digital broadcast receiver.

According to aspects of the present invention, a system, which is compatible with the existing American type digital broadcast transmitting/receiving system and which operates efficiently, is provided. While described in terms of a broadcast signal sent through air or cable, it is understood that, the transmission can be made through recording on a medium for delayed playback in other aspects of the invention.

While not required in all aspects, it is understood that aspects of the invention can be implemented as hardware, software or combinations thereof. Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A digital broadcast receiver, comprising:
a demodulator to receive a stream, and to demodulate the received stream;
an equalizer to equalize the demodulated stream; and
a decoder to process the equalized stream,
wherein the stream comprises a training sequence and data of a predetermined type disposed at a predetermined position in the stream by a digital broadcast transmitter, and at least one of the demodulator, the equalizer, and the decoder detects the training sequence from the predetermined position, and uses the detected training sequence,
wherein the stream comprising the training sequence is interleaved at the digital broadcast transmitter, and
wherein, before the interleaving, the training sequence is disposed at the predetermined position in a packet of the stream taking into consideration the result of the interleaving.

2. The digital broadcast receiver of claim 1, wherein, before the interleaving, the data of a predetermined type is disposed at a predetermined position in a packet of the stream taking into consideration the position of the training sequence in the packet of the stream and the result of the interleaving.

3. The digital broadcast receiver of claim 1, wherein, before the interleaving, the data of the predetermined type is disposed before the training sequence in the packet of the stream.

4. The digital broadcast receiver of claim 3, wherein, before the interleaving, the packet of the stream comprising the data of the predetermined type and the training sequence is disposed in a predetermined position in a field, comprising a plurality of packets, of the stream with respect to other packets of the field.

5. The digital broadcast receiver of claim 4, wherein the training sequence comprises initialization bytes which initialize a trellis encoder which trellis encodes the stream at the digital broadcast transmitter.

6. The digital broadcast receiver of claim 1, wherein, before the interleaving, the packet of the stream comprising the data of the predetermined type and the training sequence is disposed in a predetermined position in a field, comprising a plurality of packets, of the stream with respect to other packets of the field.

7. The digital broadcast receiver of claim 6, wherein the training sequence comprises initialization bytes which initialize a trellis encoder which trellis encodes the stream at the digital broadcast transmitter.

8. The digital broadcast receiver of claim 1, wherein the training sequence comprises initialization bytes which initialize a trellis encoder which trellis encodes the stream at the digital broadcast transmitter.

9. A method of processing a stream of a digital broadcast receiver, the method comprising:
receiving a stream;
demodulating the received stream;
equalizing the demodulated stream; and
decoding the equalized stream,
wherein the stream comprises a training sequence and data of a predetermined type disposed at a predetermined position in the stream by a digital broadcast transmitter, and at least one of the demodulating, the equalizing, and the decoding comprises detecting the training sequence from the predetermined position, and using the detected training sequence,
wherein the stream comprising the training sequence is interleaved at the digital broadcast transmitter, and
wherein, before the interleaving, the training sequence is disposed at the predetermined position in a packet of the stream taking into consideration the result of the interleaving.

10. The method of claim 9, wherein, before the interleaving, the data of a predetermined type is disposed at a predetermined position in a packet of the stream taking into consideration the position of the training sequence in the packet of the stream and the result of the interleaving.

11. The method of claim 9, wherein, before the interleaving, the data of the predetermined type is disposed before the training sequence in the packet of the stream.

12. The method of claim 11, wherein, before the interleaving, the packet of the stream comprising the data of the predetermined type and the training sequence is disposed in a predetermined position in a field, comprising a plurality of packets, of the stream with respect to other packets of the field.

13. The method of claim 12, wherein the training sequence comprises initialization bytes which initialize a trellis encoder which trellis encodes the stream at the digital broadcast transmitter.

14. The method of claim 9, wherein, before the interleaving, the packet of the stream comprising the data of the predetermined type and the training sequence is disposed in a predetermined position in a field, comprising a plurality of packets, of the stream with respect to other packets of the field.

15. The method of claim 14, wherein the training sequence comprises initialization bytes which initialize a trellis encoder which trellis encodes the stream at the digital broadcast transmitter.

16. A method of processing a stream of a digital broadcast receiver, the method comprising:
receiving a stream;
demodulating the received stream;
equalizing the demodulated stream; and
decoding the equalized stream,
wherein the stream comprises a training sequence and data of a predetermined type disposed at a predetermined position in the stream by a digital broadcast transmitter, and at least one of the demodulating, the equalizing, and the decoding comprises detecting the training sequence from the predetermined position, and using the detected training sequence,
wherein the stream comprising the training sequence is interleaved at the digital broadcast transmitter, and
wherein the training sequence comprises initialization bytes which initialize a trellis encoder which trellis encodes the stream at the digital broadcast transmitter.

17. The digital broadcast receiver of claim 16, wherein, before the interleaving, the data of the predetermined type is disposed at a predetermined position in a packet of the stream taking into consideration the position of the training sequence in the packet of the stream and the result of the interleaving.

18. The method of claim 17, wherein the training sequence comprises initialization bytes which initialize a trellis encoder which trellis encodes the stream at the digital broadcast transmitter.

19. A digital broadcast receiver, comprising:
a demodulator to receive a stream, and to demodulate the received stream;
an equalizer to equalize the demodulated stream; and
a decoder to process the equalized stream,
wherein the stream comprises a training sequence and data of a predetermined type disposed at a predetermined position in the stream by a digital broadcast transmitter, and at least one of the demodulator, the equalizer, and the decoder detects the training sequence from the predetermined position, and uses the detected training sequence,
wherein the stream comprising the training sequence is interleaved at the digital broadcast transmitter, and
wherein the training sequence comprises initialization bytes which initialize a trellis encoder which trellis encodes the stream at the digital broadcast transmitter.

* * * * *